(12) United States Patent
Wang et al.

(10) Patent No.: US 10,163,703 B2
(45) Date of Patent: Dec. 25, 2018

(54) METHOD FOR FORMING SELF-ALIGNED CONTACT

(71) Applicant: Taiwan Semiconductor Manufacturing Company, Ltd., Hsinchu (TW)

(72) Inventors: Chao-Hsun Wang, Chung-Li (TW); Shih-Wen Liu, Taoyuan (TW); Fu-Kai Yang, Hsinchu (TW); Hsien-Cheng Wang, Hsinchu (TW); Mei-Yun Wang, Chu-Pei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 15/619,771

(22) Filed: Jun. 12, 2017

(65) Prior Publication Data

US 2017/0278751 A1  Sep. 28, 2017

Related U.S. Application Data

(62) Division of application No. 14/340,413, filed on Jul. 24, 2014, now Pat. No. 9,679,812.

(51) Int. Cl.
*H01L 21/768* (2006.01)
*H01L 23/485* (2006.01)
(Continued)

(52) U.S. Cl.
CPC .. *H01L 21/76895* (2013.01); *H01L 21/76834* (2013.01); *H01L 21/76883* (2013.01); *H01L 21/76897* (2013.01); *H01L 23/485* (2013.01); *H01L 21/28518* (2013.01); *H01L 21/76843* (2013.01); *H01L 21/76855* (2013.01);
(Continued)

(58) Field of Classification Search
CPC ......... H01L 21/76895; H01L 21/76834; H01L 21/7684
See application file for complete search history.

(56) References Cited

U.S. PATENT DOCUMENTS 8,759,920 B2   6/2014  Wann et al.
9,679,991 B2 *  6/2017  Jun ................... H01L 29/66795
(Continued)

FOREIGN PATENT DOCUMENTS

CN  103117296 A  5/2013
CN  103199063 A  7/2013
(Continued)

*Primary Examiner* — Dung Le
(74) *Attorney, Agent, or Firm* — Slater Matsil, LLP

(57) ABSTRACT

A method for forming a self-aligned contact is provided. In an embodiment, a metal gate is formed on a substrate, and a gate spacer is formed adjacent the metal gate. A conductive plug is formed over the substrate, with the gate spacer disposed between the metal gate and the conductive plug. The metal gate and the conductive plug are recessed. A first dielectric layer is deposited over the gate spacer, over the metal gate, over the conductive plug, and along sidewalls of the metal gate. A first opening is formed in the first dielectric layer exposing the metal gate, and a second opening is formed in the first dielectric layer exposing the conductive plug. The first opening and the second opening are filled with a first conductive material.

20 Claims, 11 Drawing Sheets

(51) Int. Cl.
*H01L 21/8234* (2006.01)
*H01L 21/285* (2006.01)

(52) U.S. Cl.
CPC ............ *H01L 21/823425* (2013.01); *H01L 2924/0002* (2013.01)

(56) References Cited

U.S. PATENT DOCUMENTS

| | | | |
|---|---|---|---|
| 2003/0049903 | A1 | 3/2003 | Mitani |
| 2005/0272256 | A1 | 12/2005 | Wang |
| 2012/0156867 | A1 | 6/2012 | Jeong et al. |
| 2013/0203214 | A1 | 8/2013 | Isobe et al. |
| 2013/0320452 | A1* | 12/2013 | Wann ............... H01L 21/823425 257/368 |
| 2014/0264499 | A1 | 9/2014 | Yuan et al. |
| 2015/0118837 | A1* | 4/2015 | Shieh ............... H01L 21/76879 438/586 |

FOREIGN PATENT DOCUMENTS

| | | |
|---|---|---|
| KR | 20040090503 A | 10/2004 |
| KR | 100464656 B1 | 1/2005 |
| KR | 20120067712 A | 6/2012 |
| KR | 20130135698 A | 12/2013 |

* cited by examiner

METHOD FOR FORMING SELF-ALIGNED CONTACT

PRIORITY CLAIM AND CROSS-REFERENCE TO RELATED APPLICATIONS

This application is a division of U.S. application Ser. No. 14/340,413, filed on Jul. 24, 2014, entitled "Semiconductor Device with Self-Aligned Contact," which application is hereby incorporated herein by reference in its entirety.

BACKGROUND

As consumer devices have gotten smaller and smaller in response to consumer demand, the individual components of these devices and their connecting pathways that form the consumer devices have decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) and their connecting pathways (e.g., interconnecting lines) within the semiconductor devices to also be reduced in size.

One potential problem of this drive to reduce the size of the individual devices is a bottleneck that has formed regarding the interconnections that electrically connect the individual active devices within the semiconductor device. In particular, as the individual interconnects continue to be reduced along with the individual transistors, resistors, etc., previously containable issues with process alignments have arisen.

Accordingly, new processes and procedures are needed to help overcome these problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
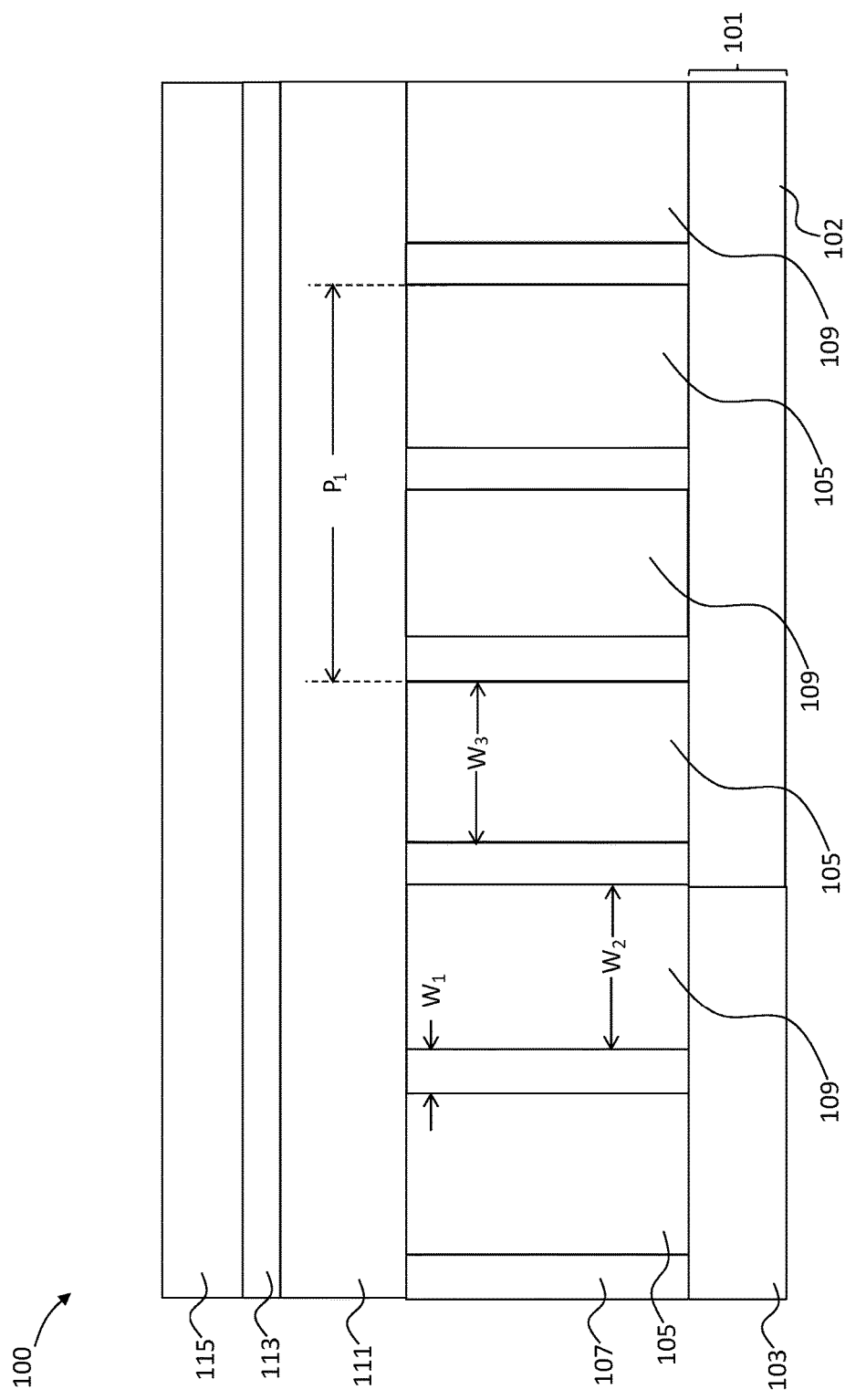
FIG. 1 illustrates a substrate with metal gates and an overlying interlayer dielectric in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Within reference now to the Figures, a self-aligned contact process that is useful for 10 nm node interconnects and lower is discussed. However, the embodiments may also be used in other interconnection processes.

With reference now to FIG. 1, there is shown a portion of a semiconductor device 100 with a semiconductor substrate 101, an active area 102 and a first isolation region 103 within the semiconductor substrate 101, gate electrodes 105, spacers 107, and a first interlayer dielectric (ILD) 109. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active area 102 may be a region of the semiconductor substrate 101 that has been activated through, e.g., implantation of dopants in order to conduct electricity in a particular fashion. The active area 102 may be doped with p-type dopants (such as boron, aluminum, gallium, or indium) and n-type dopants (such as phosphorous, arsenic, or antimony), in order to form one or more types of semiconductor devices, such as a transistor with the gate electrodes 105 as illustrated in FIG. 1. However, other devices such as single-finger transistors, resistors, or the like or more complicated semiconductor structures such as SRAM cells, NOR gates, OR gates, drivers, combinations of these, or the like may also be formed with the active area 102. The active area 102 may be formed through one or more series of implantations in which the p-type and n-type dopants are implanted while regions in which doping is undesired may be protected through, e.g., masking layers.

The first isolation region 103 may be formed within the semiconductor substrate 101. In an embodiment the first isolation region 103 is a shallow trench isolation (STI), and may be formed by etching the semiconductor substrate 101 to form a trench and filling the trench with a dielectric material as is known in the art. For example, the first isolation region 103 may be filled with a dielectric material such as an oxide material, a high-density plasma (HDP) oxide, or the like, formed by methods known in the art.

Over the semiconductor substrate 101, dummy gate electrodes (not illustrated in FIG. 1 because they are removed for the formation of the gate electrodes 105), and the spacers 107 may be formed. The dummy gate electrodes may comprise a material, such as a doped or undoped polycrystalline silicon (or amorphous silicon), a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), other conductive materials, combinations thereof, or the like. In an embodiment in which the dummy gate electrodes are polysilicon, the dummy gate electrodes may be formed by depositing doped or undoped poly-silicon by low-pressure chemical vapor deposition (LPCVD) to a thickness in the range of about 400 Å to about 2,400 Å, such as about 1,400 Å.

Once the dummy gate electrodes have been formed, the dummy gate electrodes may be patterned. In an embodiment, the dummy gate electrodes may be patterned using, e.g., a photolithographic masking and etching process, whereby a photolithographic mask (also not shown in FIG. 1) is formed over the dummy gate electrodes and then exposed to a patterned light. After exposure, desired portions of the photolithographic mask are removed to expose the underlying dummy gate electrodes, which may then be etched to remove the exposed portions, thereby patterning the dummy gate electrodes.

The spacers 107 may be formed by blanket depositing one or more spacer layers (not shown) over the dummy gate electrodes and the semiconductor substrate 101. The spacer layers may comprise SiN, oxynitride, SiC, SiON, oxide, and the like and may be formed by commonly used methods such as chemical vapor deposition (CVD), plasma enhanced CVD, sputter, and other methods known in the art. The spacer layers may be patterned, such as by isotropically or anisotropically etching, thereby removing the spacer layers from the horizontal surfaces of the structure and forming the spacers 107 as illustrated in FIG. 1. In an embodiment the spacers 107 may be formed to have a first width $W_1$ of between about 30 Å and about 200 Å, such as about 90 Å.

However, as one of ordinary skill in the art will recognize, the process described above and the resulting shape of the spacers 107 as illustrated in FIG. 1 are intended to be merely illustrative and are not intended to limit the embodiments to these descriptions. Rather, any suitable number and combination of spacers, layers, and shapes may be utilized in order to form the spacers 107, and any suitable combination of spacers may alternatively be utilized.

The first ILD 109 may be formed over the semiconductor substrate 101 and between the dummy gate electrodes and the spacers 107. In an embodiment the first ILD 109 may be formed by ALD, PVD, CVD, or other acceptable methods for forming an ILD. The first ILD 109 may comprise doped or undoped silicon oxide, although other materials such as silicon nitride doped silicate glass, high-k materials, combinations of these, or the like, may alternatively be utilized. After formation of the first ILD 109, the first ILD 109, the dummy gate electrodes, and the spacers 107 may be planarized using suitable techniques such as a chemical mechanical polish (CMP) process. In an embodiment the first ILD 109 may have a second width $W_2$ of between about 100 Å and about 400 Å, such as about 200 Å.

Once the first ILD 109, the dummy gate electrodes, and the spacers 107 have been planarized, the dummy gate electrodes may be removed. In an embodiment the dummy gate electrodes are removed using a removal process suitable for the material that was chosen to form the dummy gate electrodes. As such, while the precise method of removal will be at least in part dependent upon the material chosen, in an embodiment in which the dummy gate electrodes are polysilicon, the dummy gate electrodes may be removed using a process such as plasma etching with an etchant such as $HBr/Cl_2$, $F_2$, or a wet etching such as $NH_4OH$, combinations of these, or the like.

Once the dummy gate electrodes have been removed, the gate electrodes 105 may be formed where the dummy gate electrodes had been previously located. In an embodiment the gate electrodes 105 are formed of a material that is suitable for the device for which they will be utilized. In an embodiment in which the gate electrodes 105 will be used for an NMOS device (along with associated source/drain regions within the semiconductor substrate 101), the gate electrodes 105 may comprises a gate electrode material suitable for an NMOS device, such as aluminum, titanium, titanium aluminum, or tantalum may be utilized. However, any other suitable conductive material, such as aluminum silicon copper or aluminum copper, may alternatively be utilized. In an embodiment the gate electrodes 105 may be formed using, e.g., a deposition process. The deposition process will continue until the openings left by the removal of the dummy gate electrodes have been filled and/or overfilled.

Once filled, a planarization process is performed in order to remove excess gate electrode material that is located outside of the openings left by the dummy gate electrodes. In an embodiment the planarization process may be a CMP process, in which chemicals and abrasives are utilized to react and grind the gate electrode material to remove and planarize the gate electrode material with the spacers 107 and the first ILD 109 to form the gate electrodes 105. However, any suitable planarization process may alternatively be utilized. In an embodiment the gate electrodes 105 may be formed to have a third width $W_3$ of between about 150 Å and about 2000 Å, such as about 300 Å and a first pitch $P_1$ of between about 400 Å and about 5000 Å, such as about 700 Å.

FIG. 1 additionally illustrates a formation of a second ILD 111, a first hard mask layer 113, and a first dielectric layer 115. In an embodiment the second ILD 111 comprises a dielectric material such as silicon oxide formed using a process such as chemical vapor deposition to a thickness of about 600 Å. However, any other suitable materials (such as silicon nitride doped silicate glass, high-k materials, combinations of these, or the like), any other suitable process (such as plasma enhanced chemical vapor deposition, atomic layer deposition, or the like), and any other suitable thickness, may alternatively be utilized.

The first hard mask layer 113 is formed over the second ILD 111 and will be used to pattern the second ILD 111 in a subsequent process. In an embodiment the first hard mask layer 113 is a material such as titanium nitride, although any other suitable materials, such as tungsten, tantalum nitride, aluminum nitride, titanium oxide, combinations of these, or the like may alternatively be utilized. The first hard mask layer 113 may be formed using a process such as chemical vapor deposition to a thickness of about 380 Å, although any suitable method, such as atomic layer deposition or physical vapor deposition, and thickness may alternatively be used.

The first dielectric layer 115 may be formed over the first hard mask layer 113. In an embodiment the first dielectric layer 115 comprises a material such as silicon oxide, although any suitable dielectric material, such as silicon nitride or silicon oxynitride, may alternatively be utilized. The first dielectric layer 115 may be formed using chemical vapor deposition to a thickness of about 400 Å, although any other suitable method, such as atomic layer deposition or physical vapor deposition and thickness may alternatively be utilized.

Figure 2:
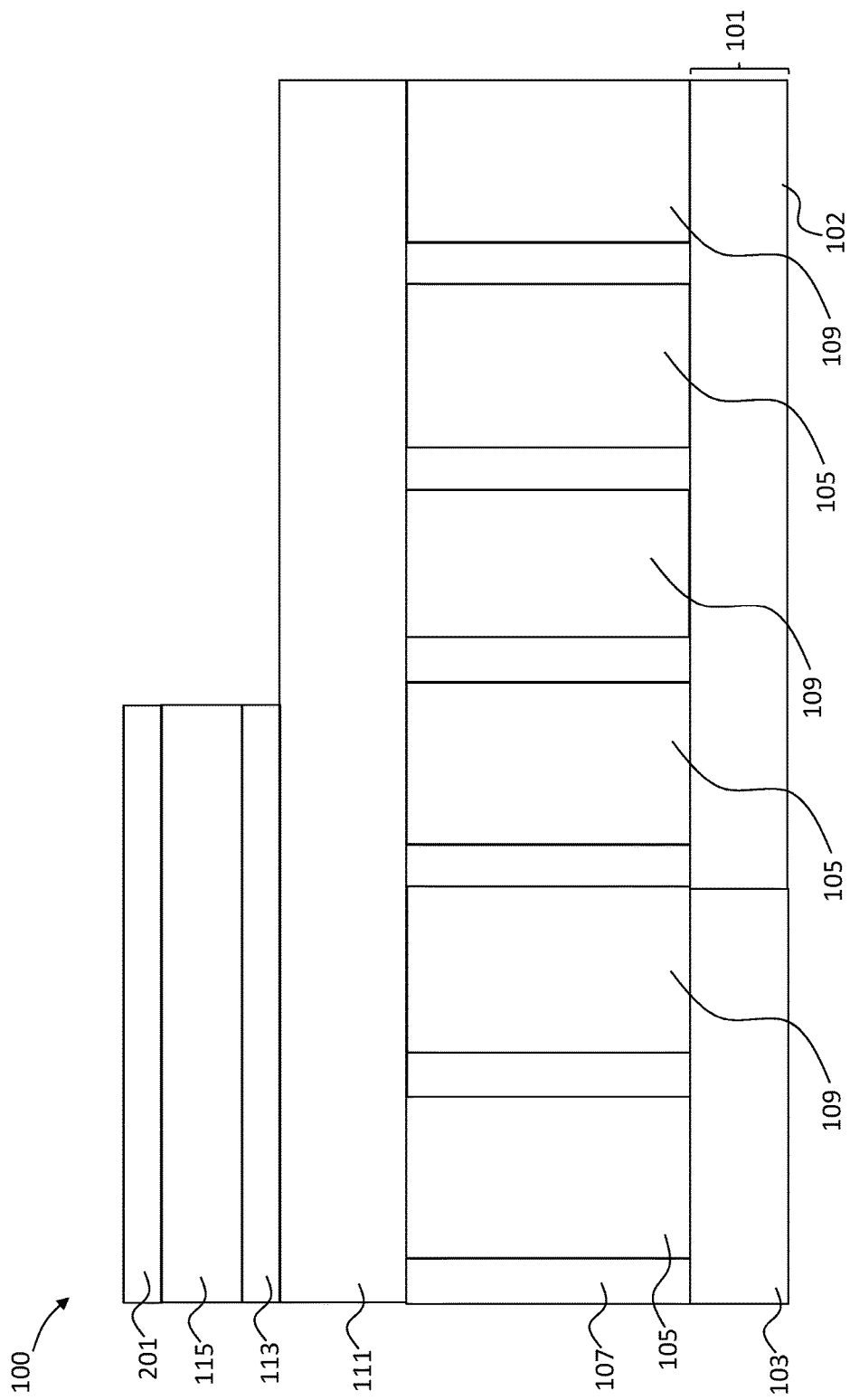
FIG. 2 illustrates a patterning of a mask for the interlayer dielectric in accordance with some embodiments.

FIG. 2 illustrates a patterning of the first dielectric layer 115 and the first hard mask layer 113 using, e.g., a first photoresist 201. In an embodiment the first photoresist 201 comprises a conventional photoresist material, such as a deep ultra-violet (DUV) photoresist, and may be deposited on the surface of the first dielectric layer 115, for example, by using a spin-on process to place the first photoresist 201. However, any other suitable material or method of forming or placing the first photoresist 201 may alternatively be utilized.

After the first photoresist 201 has been placed on the first dielectric layer 115, the first photoresist 201 may be exposed to energy, e.g. light, through a patterned reticle in order to induce a reaction in those portions of the first photoresist 201 exposed to the energy. The first photoresist 201 may then be developed, and portions of the first photoresist 201 may be removed, exposing a surface of the first dielectric layer 115 over the semiconductor substrate 101.

Once the first photoresist 201 has been patterned, the first photoresist 201 is utilized as a mask in order to pattern the underlying first dielectric layer 115. In an embodiment a dry etch such as a reactive ion etch in which etching chemicals that selectively remove the material of the first dielectric layer 115 than the first photoresist 201 are used to remove exposed portions of the first dielectric layer 115. For example, in an embodiment in which the first dielectric layer 115 is silicon oxide, the first dielectric layer 115 may be patterned using an etchant such as $CF_4$. However, any suitable removal process may alternatively be utilized.

After the first dielectric layer 115 has been patterned, the first dielectric layer 115 may be used as a mask in order to pattern the first hard mask layer 113. In an embodiment a dry etch such as a reactive ion etch may be used, in which etchants that are selective to the material of the hard mask layer (e.g., titanium nitride) are utilized to selectively remove the exposed portions of the first hard mask layer 113 that are uncovered by the patterned first dielectric layer 115. For example, in an embodiment in which the first hard mask layer 113 is titanium nitride, the first hard mask layer 113 may be patterned using an etchant such as $Cl_2$. However, any suitable removal process may alternatively be utilized.

Figure 3:
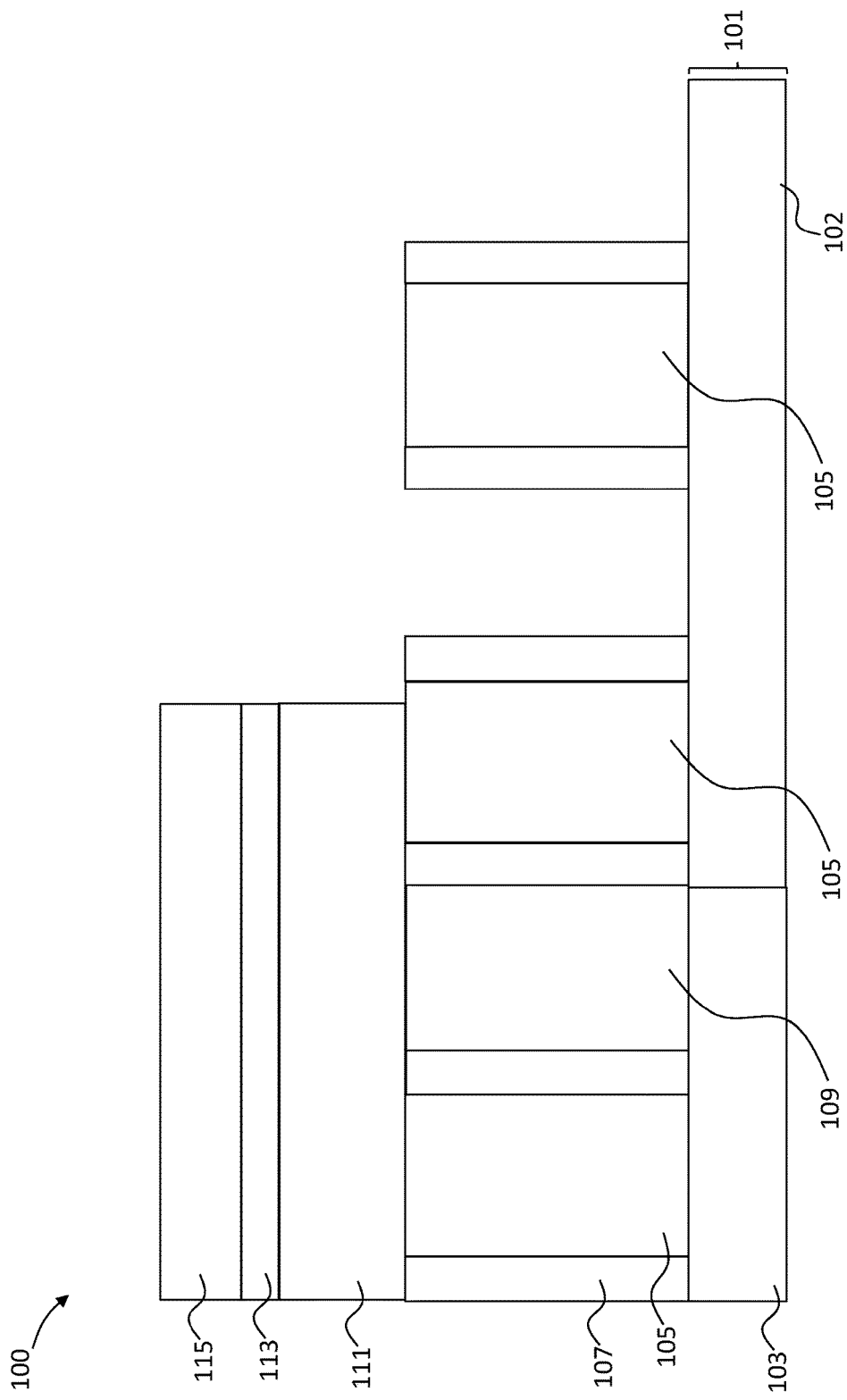
FIG. 3 illustrates a self-aligned contact etch in accordance with some embodiments.

FIG. 3 illustrates a patterning of the second ILD 111 along with a removal of selected portions of the first ILD 109. In an embodiment the second ILD 111 may be patterned using the patterned first hard mask layer 113 as a mask. In a particular embodiment, a dry etch such as a reactive ion etch is utilized to selectively remove those portions of the second ILD 111 that are uncovered by the patterned first hard mask layer 113. Etchants that are selective to the material of the second ILD 111 may be utilized so that the etching process terminates when the spacers 107 and the gate electrodes 105 are reached, such that the spacers 107 and the gate electrodes 105 are not substantially removed during the process. For example, in an embodiment in which the second ILD 111 is silicon oxide, the second ILD 111 may be patterned using an etchant such as $CF_4$. However, any suitable removal process may alternatively be utilized.

Additionally, in an embodiment in which the first ILD 109 is the same material as the second ILD 111 (e.g., silicon oxide), the etch process may be continued to remove those portions of the first ILD 109 that are not covered by the first hard mask layer 113 (e.g., those portions that are located over the active area 102 of the semiconductor substrate 101), while those portions of the first ILD 109 that remain covered (e.g., those portions located over the first isolation region 103), are not removed. Alternatively, in an embodiment in which the material of the first ILD 109 is different from the second ILD 111, a second etch process may be performed with different etchants than the etch process utilized to pattern the second ILD 111. In such a process etchants that are selective to the material of the first ILD 109 are utilized.

After the removal of the first ILD 109, a wet cleaning process may optionally be used in order to remove any residual material left over after the etching process. In an embodiment the wet cleaning process may be, e.g., an SC-1 or SC-2 cleaning procedure. However, any suitable cleaning process, such as a deionized water rinse or other rinse with a suitable cleaning solution or solvent, may alternatively be used.

Figure 4:
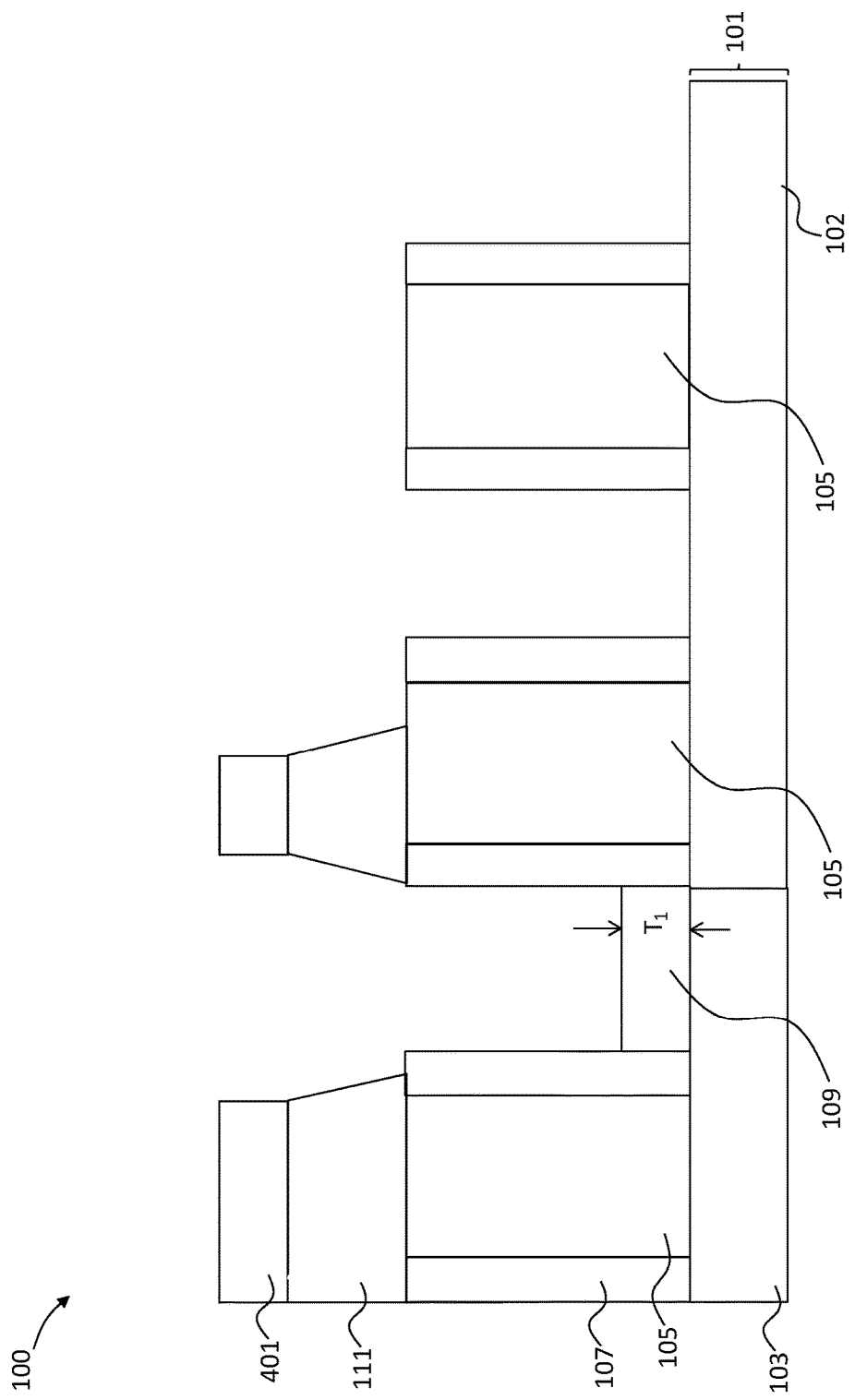
FIG. 4 illustrates a second self-aligned contact etch in accordance with some embodiments.

FIG. 4 illustrates a removal of the first photoresist 201, the first dielectric layer 115, and the first hard mask layer 113, and a second patterning of the second ILD 111. In an embodiment the first photoresist 201 may be removed using an ashing process, whereby the temperature of the first photoresist 201 is increased until it chemically degrades and may be removed. However, any other suitable removal process, such as etching or dissolving the first photoresist 201, may alternatively be utilized.

The first dielectric layer 115 and the first hard mask layer 113 may be removed using one or more etching process, such as one or more wet etching processes. In such a process etchants that are selective to the first dielectric layer 115 and the first hard mask layer 113 are applied in order to remove the first dielectric layer 115 and the first hard mask layer 113.

Once the first photoresist 201, the first dielectric layer 115, and the first hard mask layer 113 have been removed, a second photoresist 401 may be placed over the patterned second ILD 111. Once the second photoresist 401 has been placed on the second ILD 111, the second photoresist 401 may be exposed to energy, e.g. light, through a patterned reticle in order to induce a reaction in those portions of the second photoresist 401 exposed to the energy. The second photoresist 401 may then be developed, and portions of the second photoresist 401 may be removed, exposing a surface of the second ILD 111. In an embodiment the portion of the second ILD 111 that is exposed is a portion that is located over the first ILD 109 that is located over the first isolation region 103. As such, when the second ILD 111 is patterned with the pattern of the second photoresist 401, the portion of the first ILD 109 will be exposed for an etch process.

FIG. 4 also illustrates the patterning of the second ILD 111 using the second photoresist 401 as a mask. In an embodiment the second ILD 111 may be patterned this second time using a similar process as described above with respect to FIG. 3. For example, the second ILD 111 may be patterned using a dry etch with an etchant that is selective to the material of the second ILD 111.

Additionally, after the second ILD 111 has been patterned, the etching process may be continued to remove a first potion of the first ILD 109 located over the first isolation region 103. In an embodiment in which the first ILD 109 is the same material as the second ILD 111, the first ILD 109 may be etched in the same process and using the same etchants as the second ILD 111. Alternatively, in an embodiment in which the first ILD 109 is a different material than the second ILD 111, a separate etching process with etchants selective to the material of the first ILD 109 is utilized.

In an embodiment the etching of the first ILD 109 is stopped prior to a complete removal of the first ILD 109 over the first isolation region 103, leaving behind a residual portion of the first ILD 109 between the spacers 107 over the first isolation region 103. The stopping of the etching process may be performed by using a timed etching process, whereby the process is stopped after a pre-determined time has elapsed so that the process does not fully remove the first ILD 109 from over the first isolation region 103. The first ILD 109 may be etched until it has a first thickness $T_1$ over the first isolation region 103 of between about 100 Å and about 600 Å, such as about 200 Å.

By using this series of patterning processes and removal processes, the first ILD 109 between the spacers 107 is patterned twice. In the first etching process (illustrated in FIG. 3 above), an etching to expose a portion of the semiconductor substrate 101 for a first metal layer (e.g., a silicide region 501, not illustrated in FIG. 4 but illustrated and discussed below with respect to FIG. 5) may be performed. In the second etching process, a portion of the first ILD 109 is removed without exposing the underlying first isolation region 103 in order to make room for a second metal layer (e.g., plugs 601, also not illustrated in FIG. 4 but illustrated and discussed below with respect to FIG. 6). By utilizing such a series of etches, the subsequent formations of contacts may assist in the reduction of size by being substantially self-aligned with the remainder of the structures.

Figure 5:
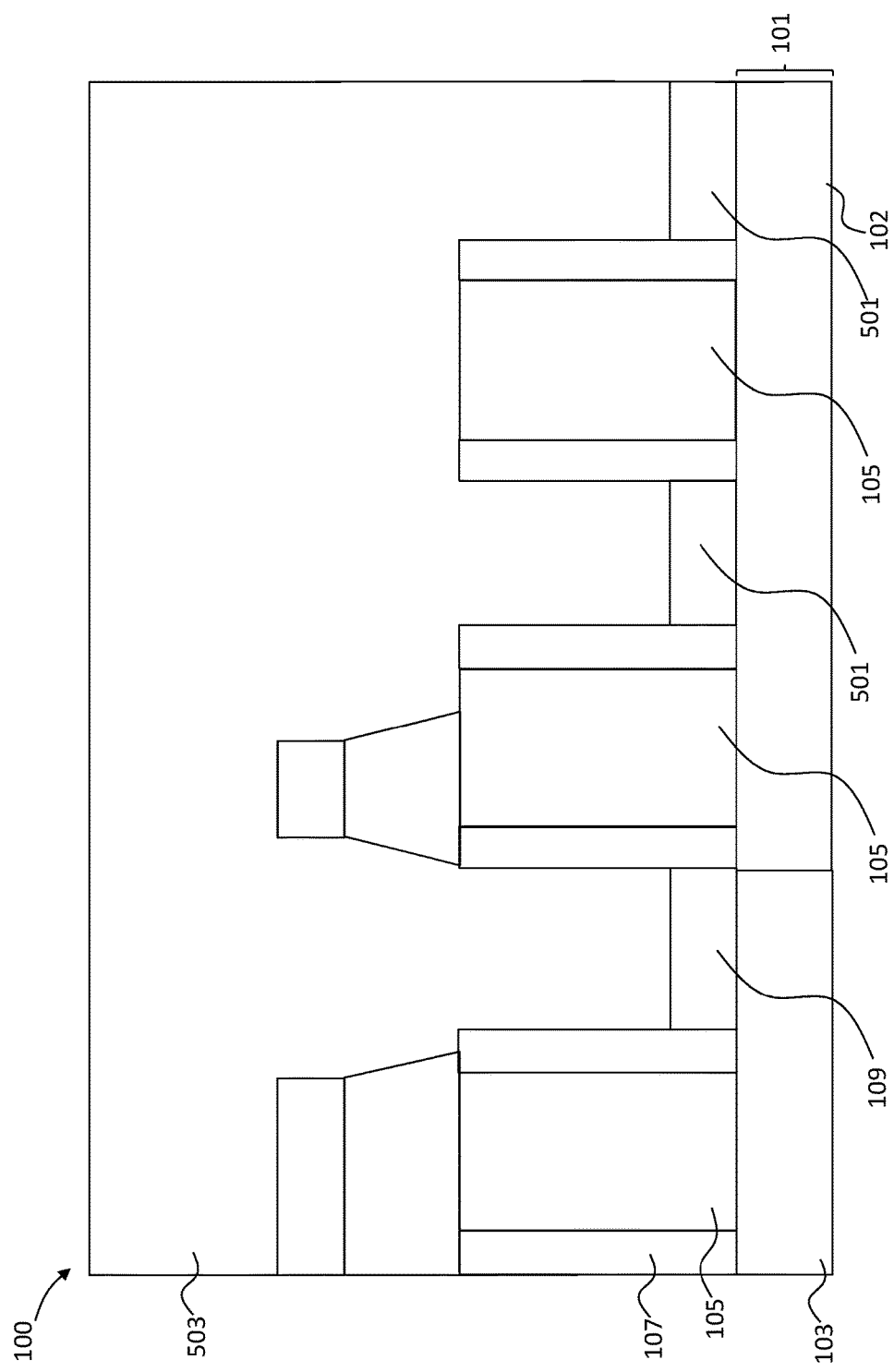
FIG. 5 illustrates formation of a conductive material in accordance with some embodiments.

FIG. 5 illustrates a formation of the silicide regions 501 along with a formation of a conductive plug material 503 over the silicide regions 501. In an embodiment the silicide regions 501 are formed from exposed portions of the active area 102 between the spacers 107. In an embodiment the formation of the silicide regions 501 may be initiated by initially forming a metal layer (not separately illustrated in FIG. 5) in contact with the semiconductor substrate 101. The metal layer may comprise a silicide precursor metal such as nickel, and may be formed through a process such as CVD. Alternatively, the metal layer may comprise any other suitable material to form a silicide with the semiconductor substrate 101, such as titanium, cobalt, palladium, platinum, erbium, combinations of these, and the like, and the metal layer may also be formed through other suitable processes, such as PECVD, physical vapor deposition (PVD), atomic layer deposition (ALD), and the like.

Once the metal layer has been formed in contact with the semiconductor substrate 101, an anneal is performed in order to diffuse and react the metal layer with the semiconductor substrate 101 to form the silicide regions 501. In an embodiment, the anneal may be, e.g., a rapid thermal anneal (RTA), where the metal layer and the semiconductor substrate 101 may be brought to a temperature of between about 150° C. and about 350° C., such as about 255° C., for a time period of between about 30 seconds and about 200 seconds, such as about 60 seconds. However, the embodiments are not intended to be limited to an RTA, as any other suitable thermal treatment, such as a laser anneal, a dynamic surface anneal, combinations of these, or the like, may alternatively be utilized.

Once the silicide regions 501 have been formed, unreacted metal from the metal layer may be removed. In an embodiment the unreacted material from the metal layer may be removed using an etchant that selectively removes the unreacted metal layer without removing the silicide, such as a solution of sulfuric acid and hydrogen peroxide, a solution of hydrochloric acid and hydrogen peroxide, or the like. Additionally, any other suitable removal agent may alternatively be utilized to remove the metal layer from over the semiconductor substrate 101.

Once the silicide regions 501 have been formed, the conductive plug material 503 may be placed in physical contact with the silicide regions 501, filling and overfilling the space between the spacers 107. In an embodiment the formation of the conductive plug material 503 may be initiated by a formation of a first glue layer (not separately illustrated in FIG. 5). In an embodiment the first glue layer is utilized to help adhere the rest of the conductive plug material 503 to the underlying structure and may be, e.g., tungsten, titanium nitride, tantalum nitride, or the like formed using a process such as CVD, plasma enhanced chemical vapor deposition (PECVD), physical vapor deposition (PVD), atomic layer deposition (ALD), and the like or the like.

Once the first glue layer has been formed, the conductive plug material 503 is formed in contact with the glue layer. In an embodiment the conductive plug material 503 is tungsten (W), although any other suitable material, such as aluminum, copper, combinations of these, or the like, may alternatively be utilized. The conductive plug may be formed using a process such as CVD, although any suitable process, such as PECVD, physical vapor deposition (PVD), atomic layer deposition (ALD), and the like, may alternatively be utilized.

Figure 6:
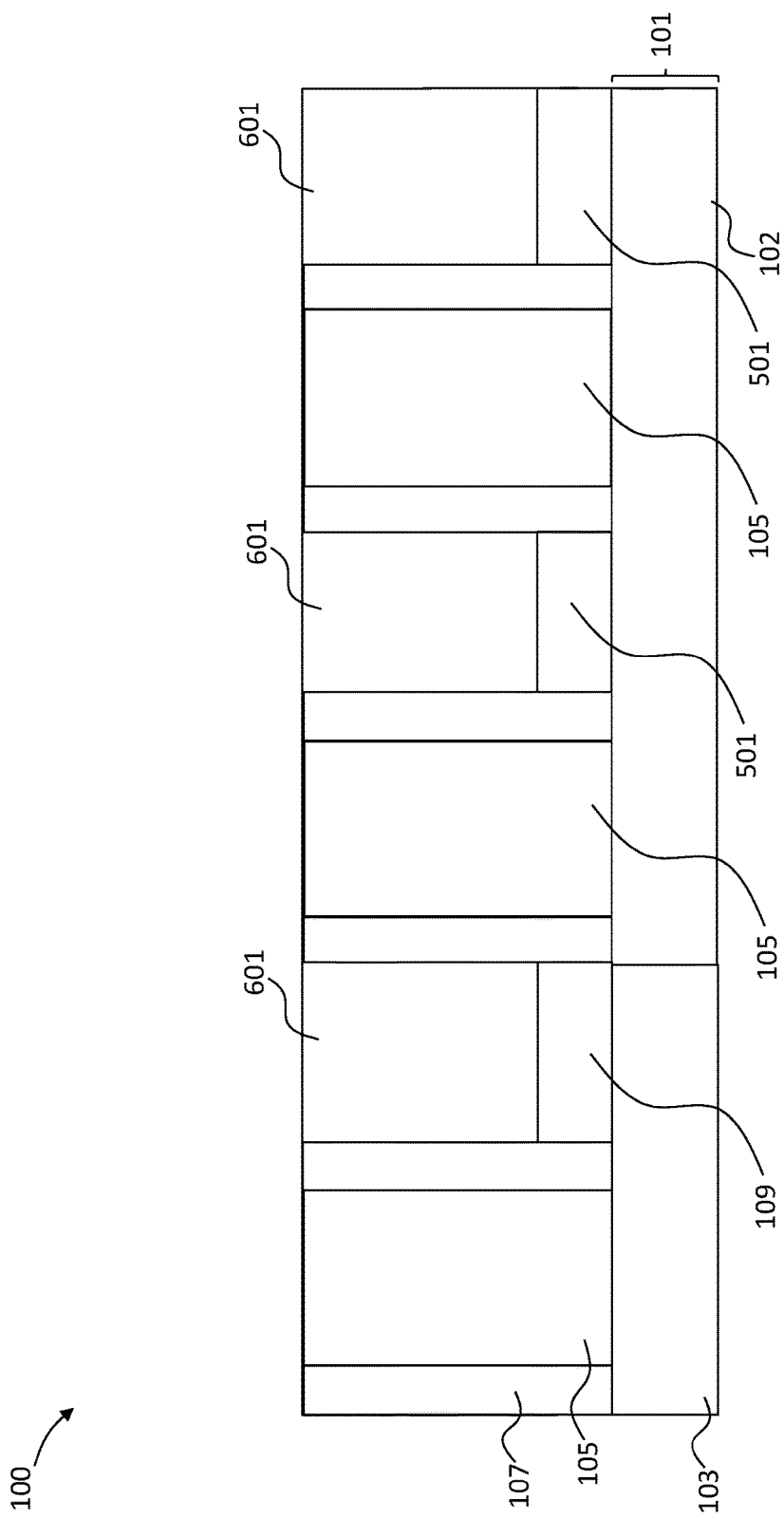
FIG. 6 illustrates a planarization process to form plugs in accordance with some embodiments.

FIG. 6 illustrates a planarization of the conductive plug material 503 (see FIG. 5) such that the conductive plug material 503 that is outside of the region between the spacers 107 is removed, forming plugs 601 (one of which is located over the remaining portion of the first ILD 109 and which may be used as a conductive line). In an embodiment the planarization process is a chemical mechanical polish (CMP), in which a combination of etching materials and abrading materials are put into contact with the conductive plug material 503 and a grinding pad (not separately illustrated) is used to grind away the conductive plug material 503 until all of the conductive plug material 503 over the spacers 107 and gate electrode 105 has been removed.

Figure 7:
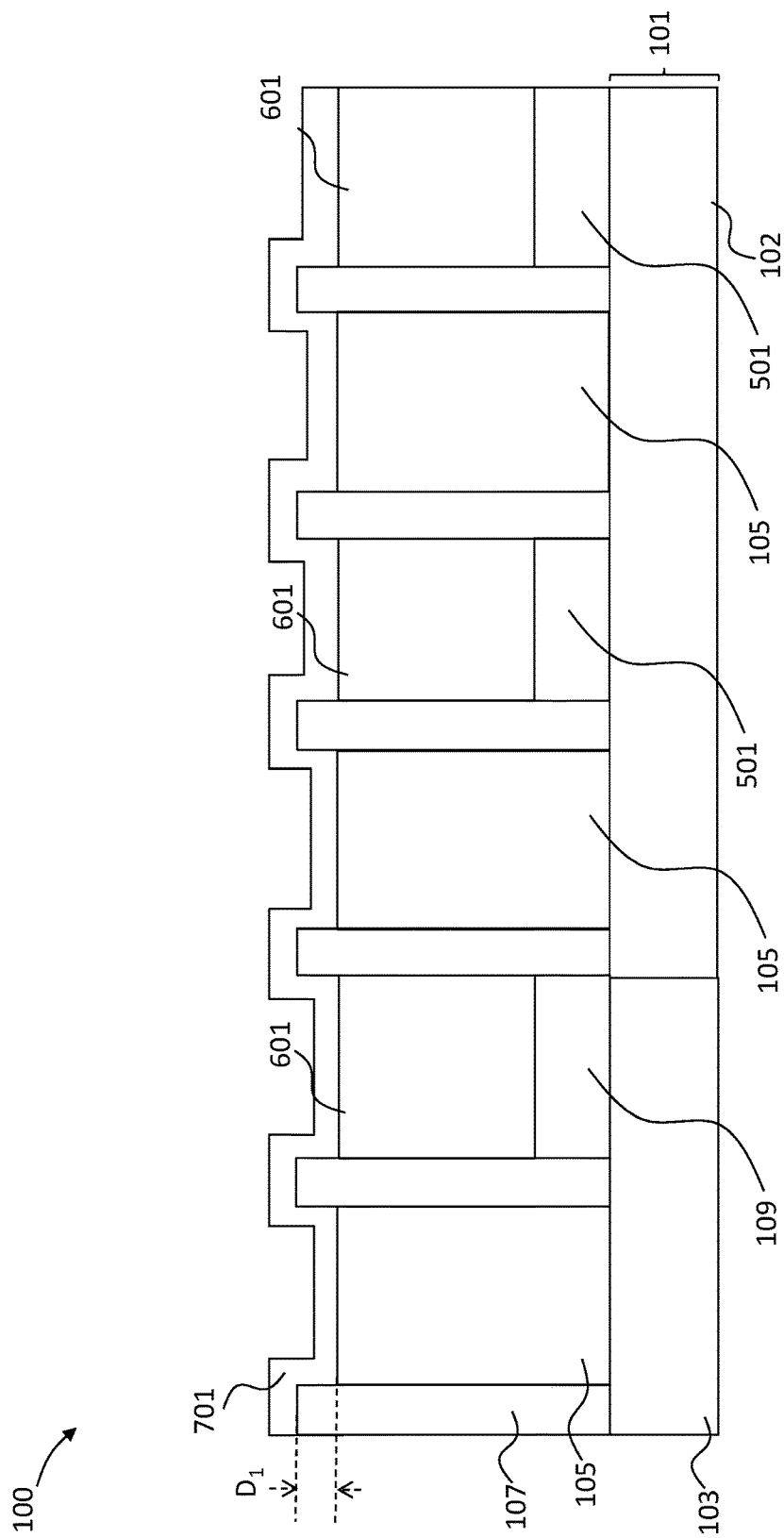
FIG. 7 illustrates a recessing of the gate metal and plugs in accordance with some embodiments.

FIG. 7 illustrates a recessing of the plugs 601 and the gate electrodes 105 along with a formation of a second dielectric layer 701. In an embodiment the plugs 601 and the gate electrodes 105 may be recessed using, e.g., a wet etching process whereby a suitable etchant that is selective to the material of the plugs 601 (e.g., tungsten) and the gate electrodes 105, is applied to the plugs 601. In an embodiment the plugs 601 and the gate electrodes 105 are recessed a same amount, such as a first distance $D_1$ below the spacers 107 of between about 100 Å and about 500 Å, such as about 200 Å, using an etchant such as $Cl_2$ In an alternative embodiment in which the gate electrodes 105 are formed from a different material than the plugs 601 (or in which the etchants cannot suitably etch both materials at the same time), the gate electrodes 105 may be recessed in a separate process than the plugs 601. As such, the etching processes may be tuned to the precise materials used for both the gate electrodes 105 and the plugs 601. Any suitable method or combination of methods may alternatively be used to recess the plugs 601 and the gate electrodes 105.

After the plugs 601 and the gate electrodes 105 have been recessed, the second dielectric layer 701 may be conformally formed over the gate electrodes 105, the plugs 601, and the spacers 107. In an embodiment the second dielectric layer 701 may be a dielectric material such as silicon nitride, although any suitable dielectric material may alternatively be utilized. The second dielectric layer 701 may be formed using a process such as chemical vapor deposition to a thickness of between about 30 Å and about 100 Å, such as about 50 Å. However, any suitable process, such as PECVD, ALD, or the like, and any suitable thickness may alternatively be utilized.

Figure 8:
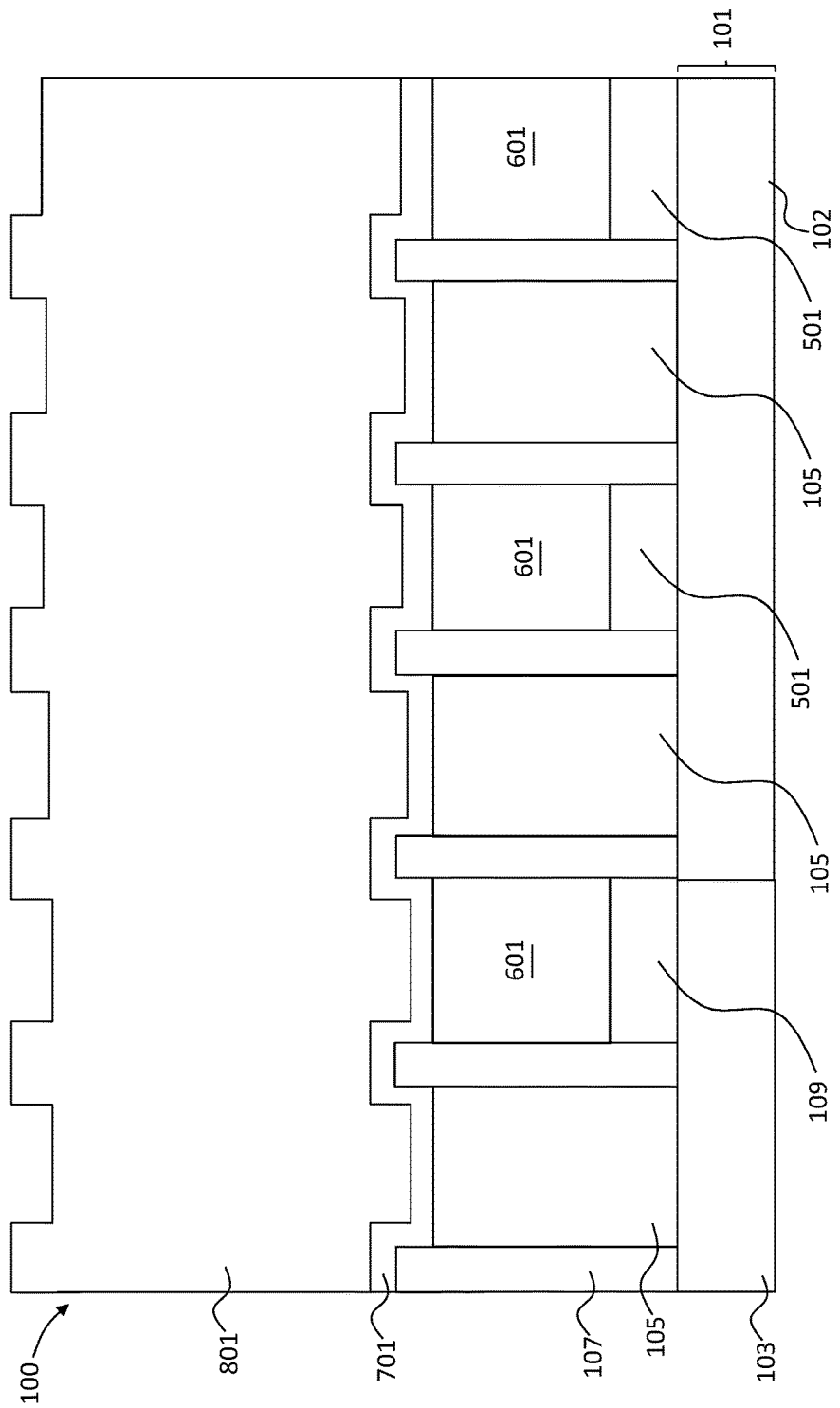
FIG. 8 illustrates forming of a dielectric layer in accordance with some embodiments.

FIG. 8 illustrates a third ILD 801 formed over the second dielectric layer 701. In an embodiment the third ILD 801 may be formed by chemical vapor deposition, sputtering, or any other methods known and used in the art for forming an ILD, using, e.g., tetra-ethyl-ortho-silicate (TEOS) and oxygen as a precursor. The third ILD 801 may be about 300 Å to about 1,000 Å in thickness, but other thicknesses may be used. The third ILD 801 may comprise doped or undoped silicon oxide, although other materials such as silicon nitride doped silicate glass, high-k materials, combinations of these, or the like, may alternatively be utilized.

Figure 9:
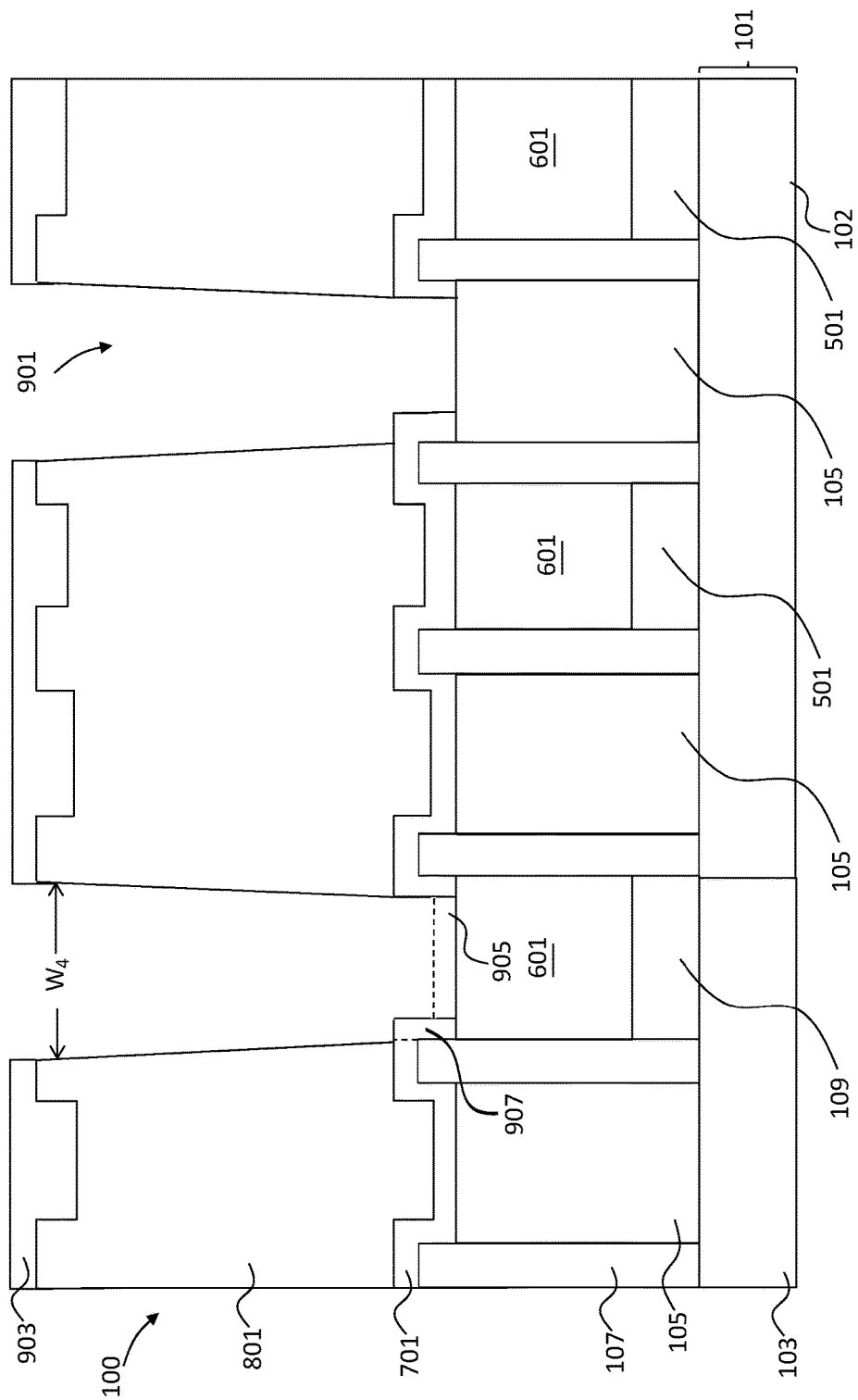
FIG. 9 illustrates a formation of openings in the dielectric layer in accordance with some embodiments.

FIG. 9 illustrates a formation of openings 901 through the third ILD 801. In an embodiment a third photoresist 903 is placed over the third ILD 801. Once the third photoresist 903 has been placed on the second ILD 111, the third photoresist 903 may be exposed to energy, e.g. light, through a patterned reticle in order to induce a reaction in those portions of the third photoresist 903 exposed to the energy. The third photoresist 903 may then be developed, and portions of the third photoresist 903 may be removed, exposing a surface of the third ILD 801.

Once the third photoresist 903 has been patterned, the openings 901 may be formed in the third ILD 801 using the third photoresist 903 as a mask in order to expose portions of the second dielectric layer 701. In an embodiment the openings 901 may be formed using a dry etch process such as a reactive ion etch with etchants selective to the material of the third ILD 801. The openings may be formed to have a fourth width $W_4$ at the top of the third ILD 801 of between about 200 Å and about 500 Å, such as about 250 Å.

The openings 901 are formed to expose a first region 905 and a second region 907 of the second dielectric layer 701. In an embodiment the first region 905 (showed for clarity in FIG. 9 with a dashed line even though it has already been removed by the point illustrated in FIG. 9), runs substantially parallel with a major surface of the semiconductor substrate 101, while the second region 907 runs substantially perpendicular to the major surface of the semiconductor substrate 101 and along an upper portion of a sidewall of the spacers 107.

Additionally, once the openings 901 have been formed through the third ILD 801, the etching process may be continued to extend the openings 901 through the second dielectric layer 701. As there is more material substantially perpendicular to the semiconductor substrate 101 in the second region 907 than the first region 905, the etching process to form the openings 901 will remove the first region 905 and expose the underlying plugs 601 before the second region 907 has been removed, allowing the openings 901 to be substantially self-aligned to the underlying plugs 601. In an embodiment in which the gate electrodes 105 and the plugs 601 have the same height, the openings 901 can land on both the gate electrodes 105 and the plugs 601 simultaneously with the same patterning process.

Figure 10:
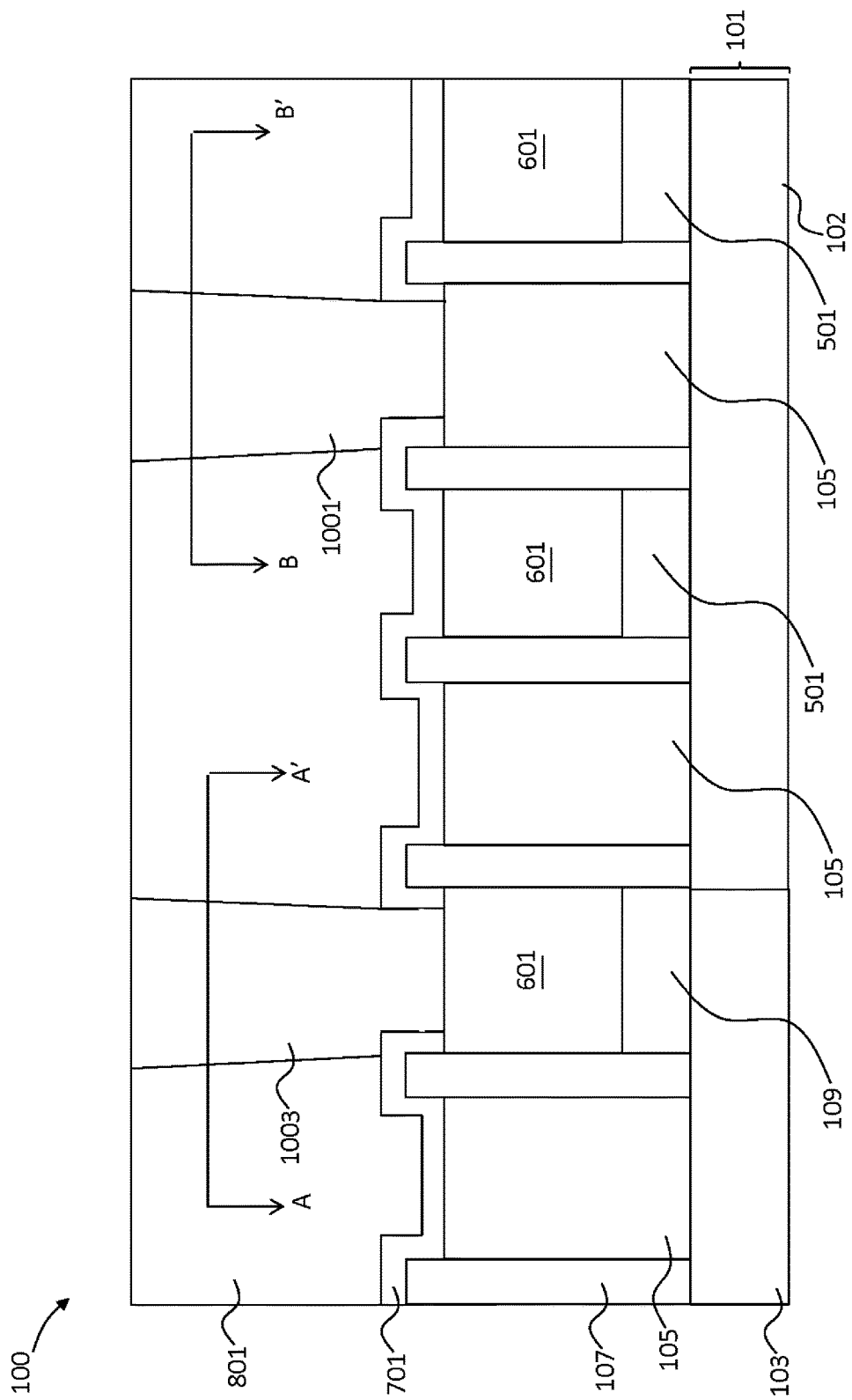
FIG. 10 illustrates formation of contacts in the openings in accordance with some embodiments.

FIG. 10 illustrates a filling of the openings 901 with a conductive material 1001 and a planarization of the conductive material with the third ILD 801 to form via contacts 1001 and 1003. In an embodiment the conductive material may be formed by initially forming an optional second glue layer (not separately illustrated in FIG. 1), which may be similar to the first glue layer (discussed above with respect to FIG. 5). Once the second glue layer has been formed, the conductive material may be formed in contact with the second glue layer.

In an embodiment the conductive material may be a metal such as tungsten, although any other suitably conductive material, such as aluminum, copper, or the like, may alternatively be utilized. The conductive material may be formed using a deposition process such as CVD, although any other suitable deposition process (such as PECVD, ALD, or the like), may alternatively be utilized. The conductive material may be deposited to fill and overfill the openings 901.

FIG. 10 also illustrates a planarization process used to remove excess portions of the conductive material and form the contacts 1001 and 1003. The contacts 1001 are formed in the third ILD 801 and are electrically connected to the gate electrodes 105 between the spacers 107. The contacts 1003 are formed in the third ILD 801 and are electrically connected to the plugs 601 between the spacers 107. In an embodiment the planarization process is a chemical mechanical polish (CMP), in which a combination of etching materials and abrading materials are put into contact with the conductive material and a grinding pad (not separately illustrated) is used to grind away the conductive material until all of the conductive material over the third ILD 801 has been removed.

Figure 11:
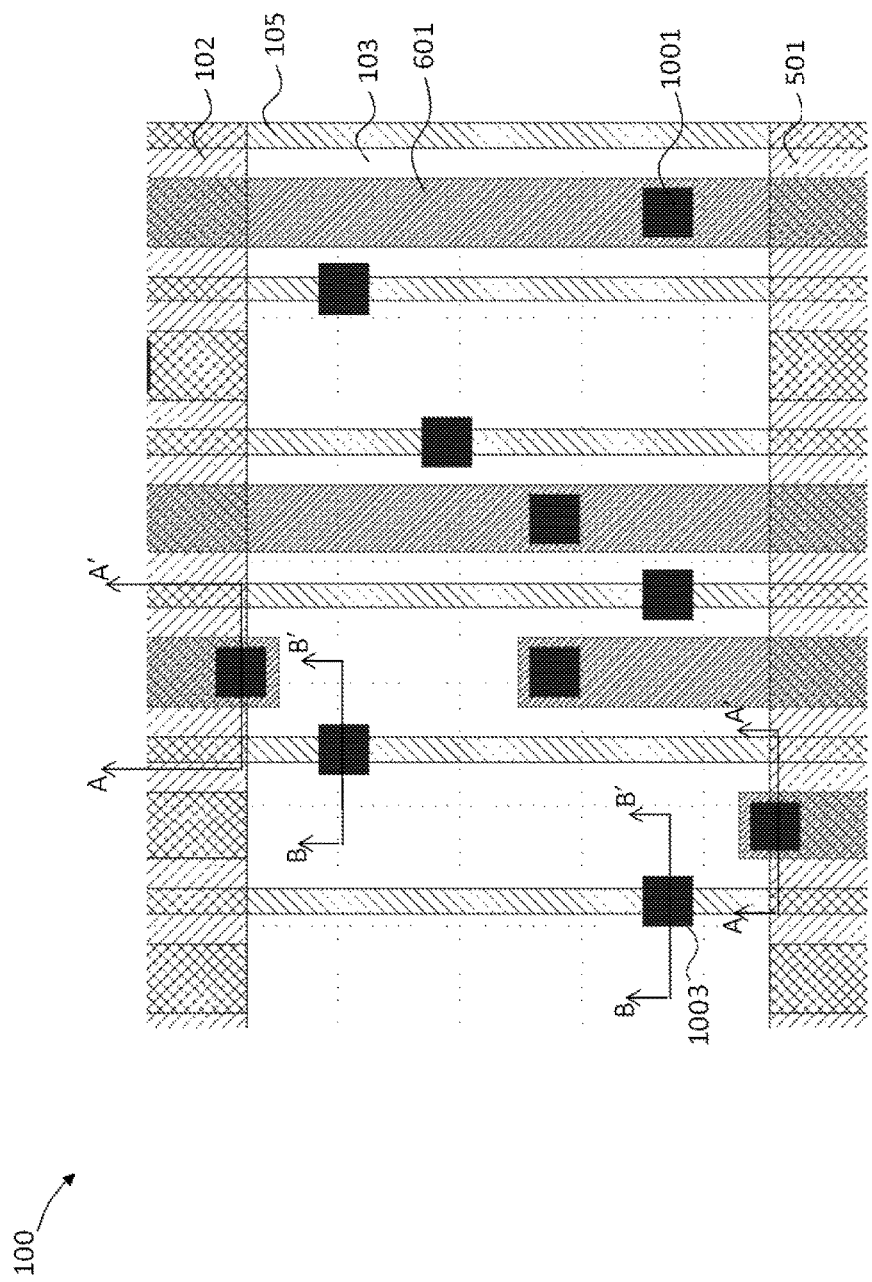
FIG. 11 illustrates a top-down view of a layout in accordance with some embodiments.

FIG. 11 illustrates a top down planar view of one embodiment utilizing multiple ones of the structures illustrated, e.g., in FIG. 10. For example, the lines A-A' in FIG. 11 correspond to a top down view of structures similar to the line A-A' in FIG. 10, while the lines B-B' in FIG. 11 correspond to a top down view of structures similar to the line B-B' in FIG. 10. In this embodiment the contacts 1001 and 1003 are utilized to electrically connect the plugs 601 and the gate electrodes 105. However, any suitable layout may alternatively be utilized.

By utilizing the above process for a self-aligned contact etching methodology to form the plugs 601 and the contacts 1001 and 1003, the cross-connections that can occur between the plugs 601 and the gate electrodes 105 due to misalignment may be reduced or even eliminated. Additionally, by utilizing the recessed gate electrodes 105 and the recessed plugs 601 along with the second dielectric layer 701, there is no need to place additional materials and process steps between the steps to form the contacts 1001 and 1003 and the gate electrodes 105.

In accordance with an embodiment, a semiconductor device comprising a first conductor over a substrate, the first conductor having a first top surface, is provided. A spacer is adjacent to the first conductor, the spacer having a second top surface further from the substrate than the first top surface. A second conductor is in electrical connection with the substrate and located on an opposite side of the spacer than the first conductor, the second conductor having a third top surface, wherein the second top surface is further from the substrate than the third top surface. A first dielectric layer is adjacent to a sidewall of the spacer, over a portion of the first conductor, and over a portion of the second conductor. A contact extends through the first dielectric layer and in physical contact with the first conductor.

In accordance with another embodiment, a semiconductor device comprising a spacer extending away from a substrate, a first metal gate recessed from the spacer, and a conductive plug recessed from the spacer is provided. A first dielectric layer is over the spacer and at least partially over the first metal gate and the conductive plug, wherein the first dielectric layer is in contact with at least one sidewall of the spacer. A first contact extends through the first dielectric layer and in physical contact with the first metal gate. A second contact extends through the first dielectric layer and in physical contact with the conductive plug.

In accordance with yet another embodiment, a method of manufacturing a semiconductor device comprising providing a metal gate with a first spacer on a first side of the metal gate and a second spacer on a second side of the metal gate, wherein a first portion of a dielectric material is located in a first region adjacent to the first spacer and a second portion of the dielectric material is located in a second region adjacent to the second spacer, is provided. The first portion of the dielectric material is fully removed from the first region, and the second portion of the dielectric material is partially removed from the second region, the partially removing the second portion leaving a third portion of the dielectric material. A conductive material is formed over the third portion of the dielectric material and within the first region. The conductive material and the metal gate are recessed from a top surface of the first spacer and the second spacer. A first dielectric layer is formed conformally over the conductive material, the first spacer, and the second spacer after the recessing the conductive material. A first contact is formed through the first dielectric layer and in contact with the conductive material. A second contact is formed through the first dielectric layer and in contact with the metal gate.

In accordance with yet another embodiment, a method includes: forming a gate stack on a substrate; forming a first and second gate spacer adjacent the gate stack; depositing an interlayer dielectric (ILD) adjacent the first and second gate spacers; removing a first portion of the ILD adjacent the first gate spacer to form a first opening exposing the substrate; recessing a second portion of the ILD adjacent the second gate spacer to form a first recess; filling a first conductive material in the first opening and over the second portion of the ILD remaining in the first recess; and depositing a first dielectric layer over the first conductive material, the gate stack, and the first and second gate spacers.

In accordance with yet another embodiment, a method includes: forming a metal gate on a substrate; forming a gate spacer adjacent the metal gate; forming a conductive plug over the substrate, the gate spacer disposed between the metal gate and the conductive plug; recessing the metal gate and the conductive plug; depositing a first dielectric layer over the gate spacer, over the metal gate, over the conductive plug, and along sidewalls of the metal gate; forming a first opening in the first dielectric layer exposing the metal gate; forming a second opening in the first dielectric layer exposing the conductive plug; and filling the first opening and the second opening with a first conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   providing a metal gate with a first spacer on a first side of the metal gate and a second spacer on a second side of the metal gate, wherein a first portion of a dielectric material is located in a first region adjacent to the first spacer and a second portion of the dielectric material is located in a second region adjacent to the second spacer;
   fully removing the first portion of the dielectric material from the first region;
   partially removing the second portion of the dielectric material from the second region, the partially removing the second portion leaving a third portion of the dielectric material;
   forming a conductive material over the third portion of the dielectric material and within the first region;
   recessing the conductive material and the metal gate from a top surface of the first spacer and the second spacer;
   forming a first dielectric layer conformally over the conductive material, the first spacer, and the second spacer after the recessing the conductive material;
   forming a first contact through the first dielectric layer and in contact with the conductive material; and
   forming a second contact through the first dielectric layer and in contact with the metal gate.

2. The method of claim 1, wherein the forming the first contact further comprises:
   forming a second dielectric layer over the first dielectric layer;
   forming an opening through the second dielectric layer to expose a portion of the first dielectric layer; and
   forming an opening through the first dielectric layer, wherein the forming the opening through the first dielectric layer leaves a portion of the first dielectric layer adjacent to a sidewall of the first spacer.

3. The method of claim 1, wherein the fully removing the first portion of the dielectric material further comprises:
   depositing a second dielectric layer over the first portion of the dielectric material;
   depositing a hard mask layer over the second dielectric layer;
   patterning the second dielectric layer with the hard mask layer to expose the first portion of the dielectric material; and
   fully removing the first portion of the dielectric material through the second dielectric layer.

4. The method of claim 1, wherein the second portion of the dielectric material is located over an isolation region.

5. The method of claim 1, further comprising forming a silicide region prior to the forming the conductive material.

6. The method of claim 1, further comprising planarizing the conductive material prior to the recessing the conductive material.

7. A method comprising:
   forming a gate stack on a substrate;
   forming a first and second gate spacer adjacent the gate stack;
   depositing an interlayer dielectric (ILD) adjacent the first and second gate spacers;
   removing a first portion of the ILD adjacent the first gate spacer to form a first opening exposing the substrate;
   recessing a second portion of the ILD adjacent the second gate spacer to form a first recess;
   filling a first conductive material in the first opening and over the second portion of the ILD remaining in the first recess;
   recessing the first conductive material to expose sidewalls of the first and second gate spacers; and
   depositing a first dielectric layer over the first conductive material, over the gate stack, and along the exposed sidewalls of the first and second gate spacers.

8. The method of claim 7, further comprising:
   depositing a second dielectric layer over the first dielectric layer;

forming a third opening in the first dielectric layer and the second dielectric layer exposing portions of the first conductive material in the first opening;
forming a fourth opening in the first dielectric layer and the second dielectric layer exposing portions of the first conductive material in the first recess; and
filling the third opening and the fourth opening with a second conductive material.

9. The method of claim 8, wherein the third opening exposes a top surface of the first dielectric layer.

10. The method of claim 8, wherein the third opening exposes a side of the first dielectric layer.

11. The method of claim 8, further comprising:
planarizing the second conductive material and the second dielectric layer, remaining portions of the second conductive material forming a first via contact and a second via contact.

12. The method of claim 7, further comprising:
annealing the first conductive material to form a silicide coupled to the substrate and portions of the first conductive material in the first opening.

13. The method of claim 7, further comprising:
planarizing the first conductive material such that top surfaces of the first conductive material, the first gate spacer, the second gate spacer, and the gate stack are level.

14. The method of claim 13, further comprising:
after the planarizing the first conductive material, recessing the first conductive material and the gate stack.

15. The method of claim 14, wherein after depositing the first dielectric layer, the first dielectric layer has a first portion disposed over the first gate spacer, a second portion disposed over the gate stack, and a third portion disposed over the first conductive material, wherein the first portion of the first dielectric layer is disposed further from the substrate than the second portion of the first dielectric layer and the third portion of the first dielectric layer.

16. A method comprising:
forming a metal gate on a substrate;
forming a gate spacer adjacent the metal gate;
forming a conductive plug over the substrate, the gate spacer disposed between the metal gate and the conductive plug;
recessing the metal gate and the conductive plug such that top surfaces of the metal gate and the conductive plug are below a top surface of the gate spacer;
depositing a first dielectric layer over the gate spacer, over the metal gate, over the conductive plug, and along sidewalls of the metal gate;
forming a first opening in the first dielectric layer exposing the metal gate;
forming a second opening in the first dielectric layer exposing the conductive plug; and
filling the first opening and the second opening with a first conductive material.

17. The method of claim 16, wherein the forming the conductive plug over the substrate comprises:
recessing an interlayer dielectric (ILD) on the substrate to form a third opening;
forming a second conductive material in the third opening over remaining portions of the ILD; and
planarizing the second conductive material such that top surfaces of the second conductive material, the metal gate, and the gate spacer are level, remaining portions of the second conductive material in the third opening forming the conductive plug.

18. The method of claim 16, further comprising depositing a second dielectric layer over the first dielectric layer.

19. The method of claim 18, wherein the first opening and the second opening are formed through the first dielectric layer and the second dielectric layer.

20. The method of claim 18, further comprising planarizing the first conductive material to form a first contact and a second contact in the second dielectric layer, wherein after the planarizing, the first contact and the second contact each have a sidewall with a first portion and a second portion offset from the first portion, wherein the first portion is located over the first dielectric layer and wherein the second portion is located adjacent to the first dielectric layer.

\* \* \* \* \*